United States Patent [19]
Wang

[11] Patent Number: 6,091,101
[45] Date of Patent: Jul. 18, 2000

[54] MULTI-LEVEL FLASH MEMORY USING TRIPLE WELL

[75] Inventor: Ling-Sung Wang, Hsinchu, Taiwan

[73] Assignee: Worldwide Semiconductor Manufacturing Corporation, Hsinchu, Taiwan

[21] Appl. No.: 09/050,741

[22] Filed: Mar. 30, 1998

[51] Int. Cl.[7] .................................... H01L 29/94
[52] U.S. Cl. .............. 257/315; 257/316; 365/185.01; 438/257; 438/258
[58] Field of Search ................... 257/315, 316, 257/318; 438/257, 258; 365/185.01

[56] References Cited

U.S. PATENT DOCUMENTS

| | | | |
|---|---|---|---|
| 5,610,419 | 3/1997 | Tanaka | 257/315 |
| 5,751,631 | 5/1998 | Liu et al. | 365/185.01 |
| 5,801,415 | 9/1998 | Lee et al. | 257/316 |

FOREIGN PATENT DOCUMENTS

| | | | |
|---|---|---|---|
| 5-129626 | 5/1993 | Japan | 257/316 |
| 5-145082 | 6/1993 | Japan | 257/316 |

*Primary Examiner*—Valencia Martin-Wallace
*Attorney, Agent, or Firm*—Blakely Sokoloff Taylor & Zafman LLP

[57] ABSTRACT

A multi-level flash memory cell formed in a semiconductor substrate. The memory cell comprises: (a) a deep n-well formed in said semiconductor substrate; (b) a p-well formed within said deep n-well; (c) a first insulating layer formed over said p-well; (d) three floating gates adjacent to and insulated from one another and lying atop said first insulating layer; (e) source and drain regions formed in said p-well and on either side of said three floating gates; (f) a second insulating layer atop said three floating gates and said drain and source regions; and (g) a control gate formed atop said second insulating layer.

10 Claims, 3 Drawing Sheets

MULTI-LEVEL FLASH MEMORY USING TRIPLE WELL

FIELD OF THE INVENTION

This invention relates to semiconductor flash memory, and more particularly, to a multi-level flash memory using a triple well process.

BACKGROUND OF THE INVENTION

Flash memory is classified as non-volatile memory because a memory cell in the flash memory can retain the data stored in the memory cell without periodic refreshing. Most prior art flash memory can store a single bit in a memory cell. In other words, the memory cell can either store a "one" or a "zero". Multi-level flash memory can store two bits per memory cell.

Multi-level flash memory is becoming more popular because of its advantages. In particular, multi-level flash memory lowers the cost per bit for non-volatile memory storage. Further, multi-level flash memory also allows for higher density memories because each memory cell can store two or more bits of data.

Prior art multi-level flash memory has suffered from the problem of difficulty in controlling the data level in the memory cell. Complex electrical circuits are needed to control the program and erase data level of these prior art memory cells. The most difficult aspect is that the data level will shift after cycling tests. What is needed is a multi-level flash memory cell design that is easily written to and read from and is easy to manufacture.

SUMMARY OF THE INVENTION

The present invention provides a new memory cell structure that is easily programmable. A multi-level flash memory cell formed in a semiconductor substrate is disclosed. The memory cell comprises: (a) a deep n-well formed in said semiconductor substrate; (b) a p-well formed within said deep n-well; (c) a first insulating layer formed over said p-well; (d) three floating gates adjacent to and insulated from one another and lying atop said first insulating layer; (e) source and drain regions formed in said p-well and on either side of said three floating gates; (f) a second insulating layer atop said three floating gates and said drain and source regions; and (g) a control gate formed atop said second insulating layer.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

Figure 1:
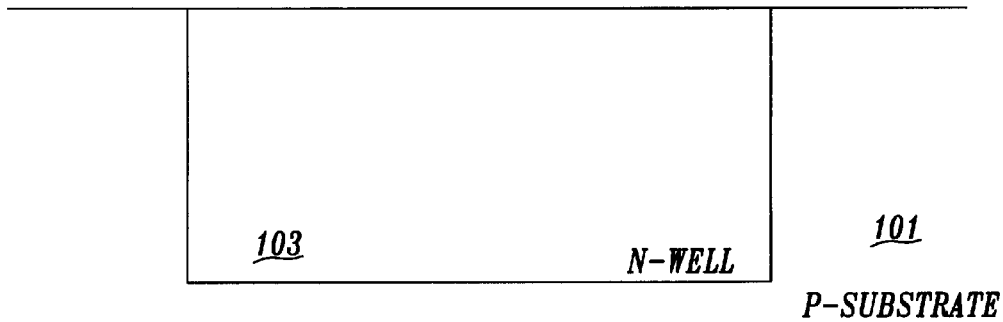
FIGS. 1–6 are cross-sectional views of a semiconductor substrate illustrating the steps in forming a multi-level flash memory cell in accordance with the present invention.

Turning to FIG. 1, a p-type silicon substrate 101 is provided. Within the silicon substrate 101, a deep n-well 103 is formed using conventional masking and high energy ion implantation techniques. In particular, a photoresist mask is formed on the surface of the silicon substrate 101. Next, an ion implantation step is performed by implanting n-type (for example phosphorous) impurities into the silicon substrate. It is preferred that the depth of the deep n-well is 2–3 microns into the surface of the silicon substrate 101. An ion implant energy of 2–3 Mev is sufficient to form this deep n-well 103.

Figure 2:
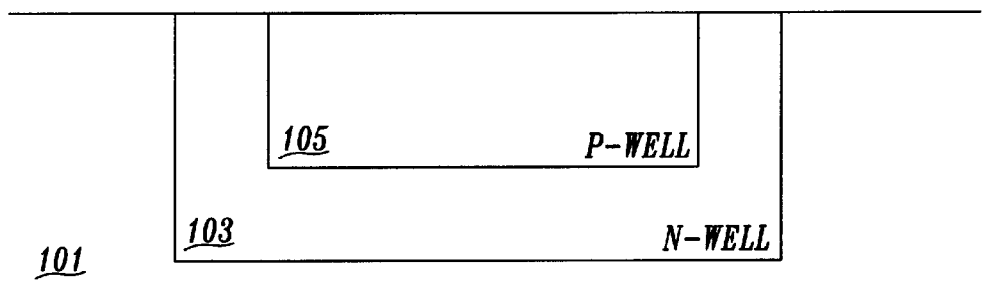

Next, turning to FIG. 2, a p-well 105 is formed within the deep n-well 103. Note that the p-well 105 is completely contained within the deep n-well 103. It is preferred that the depth of the p-well 105 be approximately 1–2 microns into the surface of the silicon substrate 101. An ion implant energy of 250–400 Kev is sufficient to form the p-well 105.

Figure 3:
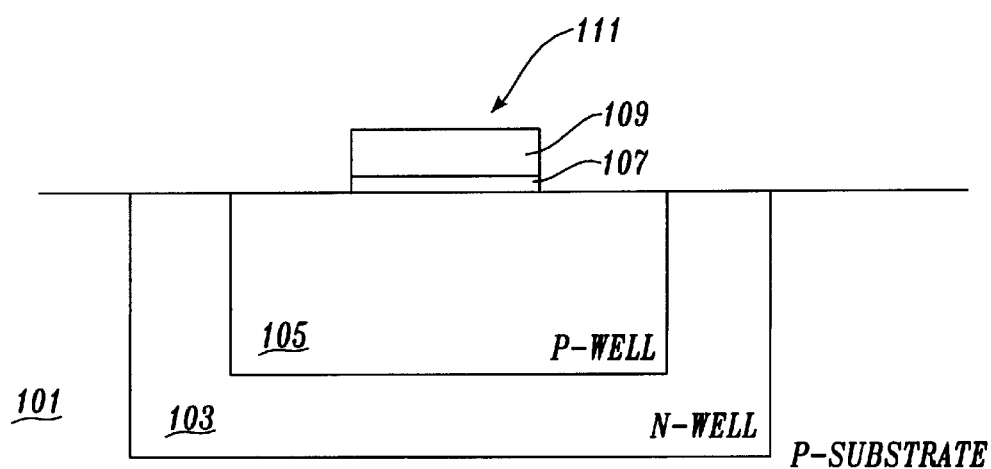

Next, turning to FIG. 3, a thin gate oxide 107 is grown on the silicon substrate 101. Preferable, the gate oxide 107 (when the gate oxide is silicon dioxide) is thermally grown in an oxygen ambient to a thickness of approximately 80–100 angstroms. Alternatively, the gate oxide 107 may be formed using a LPCVD technique. Next, a first polysilicon layer 109 is deposited over the gate oxide 107. The first polysilicon layer 109 is preferably in-situ doped polysilicon. The layer of gate oxide 107 and first polysilicon layer 109 is then patterned and etched to provide an intermediate structure 111 shown in FIG. 3. Further, the preferred length of the intermediate structure 111 is approximately 0.35 microns. By keeping the length of the intermediate structure 111 at a relatively long 0.35 microns, the "punch through" phenomena is suppressed.

Figure 4:
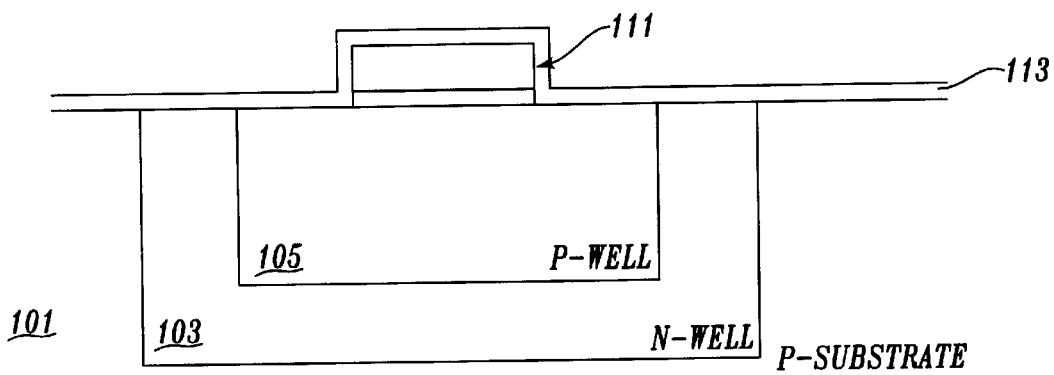

Next, turning to FIG. 4, an insulating dielectric 113 is conformally formed over the intermediate structure 111 and the silicon substrate 101. Preferably, the insulating dielectric 113 is a triple layer of oxide/nitride/oxide, also referred to as ONO. The ONO dielectric layer is a well known composite layer and any suitable technique for its deposit may be used. In the preferred embodiment, ONO is used because of its superior insulation properties which leads to improved data retention. In the preferred embodiment, the ONO composite layer is formed from 60 angstroms of high temperature CVD oxide, 100 angstroms of silicon nitride, and 60 angstroms of high temperature CVD oxide.

Figure 5:
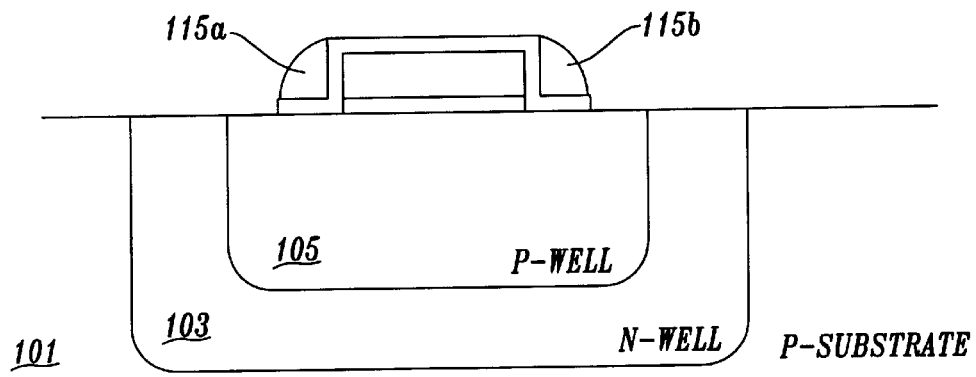

Next, turning to FIG. 5, a second polysilicon layer of approximately 0.15 micron thickness in-situ doped polysilicon is deposited over the entire silicon substrate. The second polysilicon layer is then etched back to form polysilicon sidewall spacers 115a and 115b. Further, the portion of the ONO oxide layer 113 outside of the polysilicon sidewall spacers 115a and 115b is removed using conventional techniques. As is known in the art, by changing the height of the intermediate structure, the width of the polysilicon sidewall spacers 115a and 115b may be controlled. In the preferred embodiment, the height of the first polysilicon layer is 0.15 microns. With this height, the width of the polysilicon sidewall spacers 115a and 115b is on the order of 0.12 microns.

Figure 6:
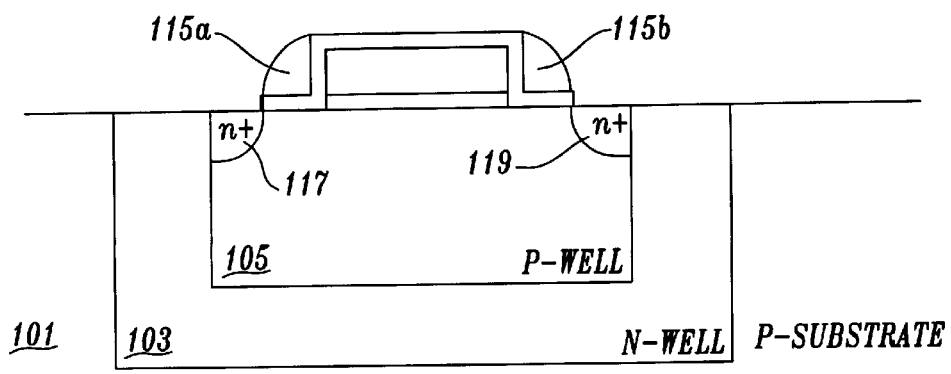

Next, turning to FIG. 6, source region 117 and drain region 119 are formed adjacent the polysilicon sidewall spacers 115a and 115b. The source region 117 and drain region 119 are n$^+$ and are a depth of 1000–2000 angstroms into the p-well 105. An ion implant energy of 50 Kev is used to form the source and drain regions. Then ion implantation may be performed using the photoresist and the polysilicon sidewall spacers as a self aligned source-drain mask.

Figure 7:
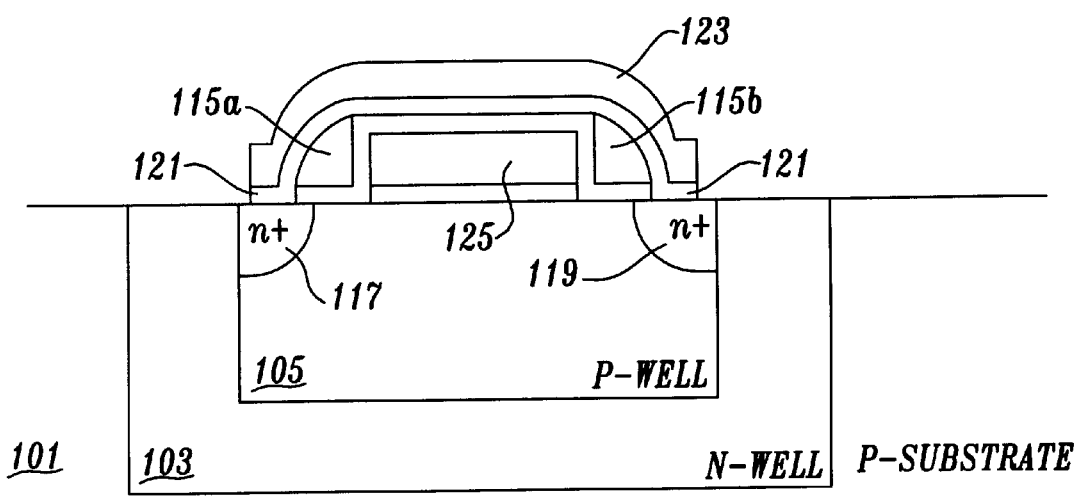
FIG. 7 is a schematic diagram of a multi-level flash memory cell formed in accordance with the present invention.

Next, turning to FIG. 7, an polysilicon oxidation step is performed to repair damage to the polysilicon sidewall spacers during the source/drain ion implantation process.

The oxidation step also serves to form an isolating dielectric layer 121 around the polysilicon sidewall spacers 115a and 115b. As will be seen below, the isolating dielectric layer 121 isolates the control gate 123 from the underlying structure. This is conventionally accomplished by heating the entire substrate in an oxygen ambient. During this thermal processing, the source region 117 and drain region 119 will laterally diffuse under the polysilicon sidewall spacers 115a and 115b.

Alternatively, a second ONO composite layer may be deposited onto the entire surface. The second ONO composite layer serves as the isolating dielectric layer 121. The choice of the ONO composite layer adds manufacturing complexity, but at the benefit of providing improved isolation and resultant data integrity. In any event, during the formation of the ONO composite layer, the thermal processing steps result in the source and drain regions laterally diffusing underneath the polysilicon sidewall spacers.

Next, a third polysilicon layer is deposited on the entire structure. The third polysilicon layer will be formed into a control gate 123. Finally, the third polysilicon layer and the second composite ONO layer are patterned and etched to provide the final structure of the multi-level flash memory cell shown in FIG. 7.

As can be seen, the two polysilicon sidewall spacers 115a and 115b constitute two floating gates. The remaining portion of the first polysilicon layer forms the third floating gate 125. Dielectric isolation surrounds all three floating gates. While ONO composite layer dielectric isolation is preferred, any isolating dielectric oxide may be used. The third polysilicon layer forms the control gate 123 that overlays the entire source, drain, and floating gate structure.

In operation, the flash memory cell can be said to store a two-bit binary signal as follows:

| Data | Floating Gate 1 Poly Spacer 115b | Floating Gate 2 Poly Spacer 115a | Floating Gate 3 Poly 125 |
| --- | --- | --- | --- |
| 00 | No Charge | No Charge | No Charge |
| 01 | Stored Charge | No Charge | No Charge |
| 10 | Stored Charge | Stored Charge | No Charge |
| 11 | Stored Charge | Stored Charge | Stored Charge |

Thus, when all of the floating gates 115a, 115b, and 125 do not contain any stored charge, the data stored in the memory cell is considered 00. When stored charge is found only in floating gate one (sidewall spacer 115b), then the data stored is considered 01. When stored charge is found in floating gate 1 (sidewall spacer 115b) and floating gate 2 (sidewall spacer 115a), then the data signal stored is considered 10. Finally, when all floating gates hold stored charge, the data signal stored is considered 11.

In order to program charge onto the various floating gates, the following voltages are applied to the control gate 123, the source 117, the drain 119, the p-well 105, and the deep n-well 103. For programming charge into the floating gate 1 (sidewall spacer 115b), a voltage of 9 volts is applied to the control gate 123, a voltage of 5 volts is applied to the drain 119, and the source 117, p-well 105, and the deep n-well 103 is held at ground. The mechanism used to program charge is channel high-injection into the floating gate 1.

For programming charge into the floating gate 2 (sidewall spacer 115a), a voltage of 9 volts is applied to the control gate 125, a voltage of 5 volts is applied to the source 117, and the drain 119, p-well 105, and the deep n-well 103 is held at ground. The mechanism used to program charge is channel high-injection into the floating gate 2.

For programming charge into the floating gate 3 (poly 125), a voltage of 9 volts is applied to the control gate 125, a voltage of −5 volts is applied to the p-well 105, and the drain 119, source 117, and the deep n-well 103 is held at ground. The mechanism used to program charge is Fowler-Nordheim tunneling into the floating gate 3.

In order to erase all of floating gates, a voltage of −10 volts is applied to the control gate 125, a voltage of 5 volts is applied to the p-well 105 and the deep n-well 103, and the drain 119 and source 117 are floating.

Finally, the read operation of the flash memory cell is performed by applying a voltage of 5 volts to the control gate 125, applying a voltage of 1.5 volts to the drain 119, and holding the source 117, p-well 105, and deep n-well 103 at ground. The application of the 1.5 volts to the drain will prevent the phenomena of "slow drain programming."

While the preferred embodiment of the invention has been illustrated and described, it will be appreciated that various changes can be made therein without departing from the spirit and scope of the invention.

The embodiments of the invention in which an exclusive property or privilege is claimed are defined as follows:

1. A multi-level flash memory cell formed in a semiconductor substrate, the memory cell comprising:
    (a) a deep n-well formed in said semiconductor substrate;
    (b) a p-well formed within said deep n-well;
    (c) a first insulating layer formed over said p-well;
    (d) three floating gates adjacent to and insulated from one another and lying atop said first insulating layer;
    (e) source and drain regions formed in said p-well and on either side of said three floating gates;
    (f) a second insulating layer atop said three floating gates and said drain and source regions; and
    (g) a control gate formed atop said second insulating layer.

2. The flash memory of claim 1 wherein two of said three floating gates are polysilicon sidewall spacers formed adjacent to a remaining one of said three floating gates.

3. The flash memory of claim 1 wherein said control gate is formed from polysilicon.

4. The flash memory of claim 1 wherein said three floating gates comprise a center floating gate, a first sidewall floating gate, and a second sidewall floating gate, said first sidewall floating gate adjacent said source region and said second sidewall floating gate adjacent said drain region.

5. The flash memory of claim 4 wherein data is stored in accordance with:

| Data | Second Sidewall Floating Gate | First Sidewall Floating Gate | Center Floating Gate |
| --- | --- | --- | --- |
| 00 | No Charge | No Charge | No Charge |
| 01 | Stored Charge | No Charge | No Charge |
| 10 | Stored Charge | Stored Charge | No Charge |
| 11 | Stored Charge | Stored Charge | Stored Charge |

6. The flash memory of claim 4 wherein:
    (1) for programming charge into said second sidewall floating gate:
        (i) a first bias voltage being applied to said control gate,
        (ii) a second bias voltage being applied to said drain region, and (iii) said source region, said p-well and said deep n-well being held at ground;
(2) for programming charge into the first sidewall floating gate:
(i) said first bias voltage being applied to said control gate,
(ii) said second bias voltage being applied to the source region, and
(iii) said drain region, said p-well and said deep n-well being held at ground;
(3) for programming charge into the center floating gate:
(i) said first bias voltage being applied to said control gate,
(ii) a third bias voltage being applied to said p-well, and
(iii) said source region, said drain region, and said deep n-well being held at ground; and
(4) for erasing all of said floating gates:
(i) a fourth bias voltage being applied to said control gate,
(ii) said second bias voltage being applied to said p-well and said deep n-well, and
(iii) said drain region and source region are floating.

7. The flash memory of claim 6 wherein said first bias voltage is 9 volts, said second bias voltage is 5 volts, said third bias voltage is −5 volts, and said fourth bias voltage is −10 volts.

8. The flash memory of claim 6 wherein a read operation of the flash memory cell is performed by applying said second bias voltage volts to said control gate, applying a fifth bias voltage to the drain region, and holding the source region, p-well, and deep n-well at ground.

9. The flash memory of claim 7 wherein said first bias voltage is 9 volts, said second bias voltage is 5 volts, said third bias voltage is −5 volts, said fourth bias voltage is −10 volts, and said fifth bias voltage is 1.5 volts.

10. A multi-level flash memory cell formed in a semiconductor substrate, the memory cell comprising:
(a) a deep n-well formed in said semiconductor substrate;
(b) a p-well formed within said deep n-well;
(c) a first insulating layer formed over said p-well;
(d) a central floating gate, a first outside floating gate, and a second outside floating gate, each of said floating gates lying adjacent to and insulated from one another and lying atop said first insulating layer;
(e) source and drain regions formed in said p-well and on either side of said first floating gate and said second floating gate;
(f) a second insulating layer atop said floating gates and said drain and source regions; and
(g) a control gate formed atop said second insulating layer.

* * * * *